United States Patent [19]

Massey et al.

[11] Patent Number: 4,738,618
[45] Date of Patent: Apr. 19, 1988

[54] VERTICAL THERMAL PROCESSOR

[75] Inventors: Robert G. Massey; Donald W. Heidt; Billy B. Williams, all of Whiteright, Tex.

[73] Assignee: Semitherm, Kalispell, Mont.

[21] Appl. No.: 49,591

[22] Filed: May 14, 1987

[51] Int. Cl.⁴ .............................................. F27D 3/12
[52] U.S. Cl. .................................. 432/241; 432/207; 432/208
[58] Field of Search ............... 432/207, 208, 239, 241, 432/242

[56] References Cited

U.S. PATENT DOCUMENTS

| | | | |
|---|---|---|---|
| 2,432,239 | 12/1947 | Hoak | 432/207 |
| 2,635,866 | 4/1953 | Olson | 432/207 |
| 3,166,305 | 1/1965 | Troglione et al. | 432/241 X |
| 3,463,470 | 8/1969 | Green et al. | 432/241 X |
| 4,459,104 | 7/1984 | Wollmann | 432/208 X |
| 4,490,111 | 12/1984 | Yakura | 432/208 X |
| 4,610,628 | 9/1986 | Migushina | 432/241 |

*Primary Examiner*—William E. Tapolcai
*Attorney, Agent, or Firm*—Hugh D. Jaeger

[57] ABSTRACT

Vertically oriented thermal processor, also known as a vertical diffusion furnace for the processing of silicon or gallium arsenide wafers or substrates including a vertically positionable furnace assembly, and a quartz bell-jar shaped element which positions coaxially over and about another quartz bell jar like vertically positionable process tube forming a dual wall contamination barrier. The furnace and the process tube bell jar can be moved up and down pneumatically as a unit or independently of one another during processing modes. Pneumatic cylinders provide for the lifting of the furnace element away from the wafers to ramp temperatures downwardly at an accelerated rate. An overhead track positions for accelerated removal of the furnace and process tube to the exterior of the cabinet without disconnection of electrical, pneumatic or gas connections for maintenance or component changeout. A microprocessor controls and monitors all functions of the vertical thermal processor, and includes a rear microprocessor control as well as a front panel control. Silicon wafer loads can be loaded from the front, side or back by manual, softlander or robotic means.

12 Claims, 16 Drawing Sheets

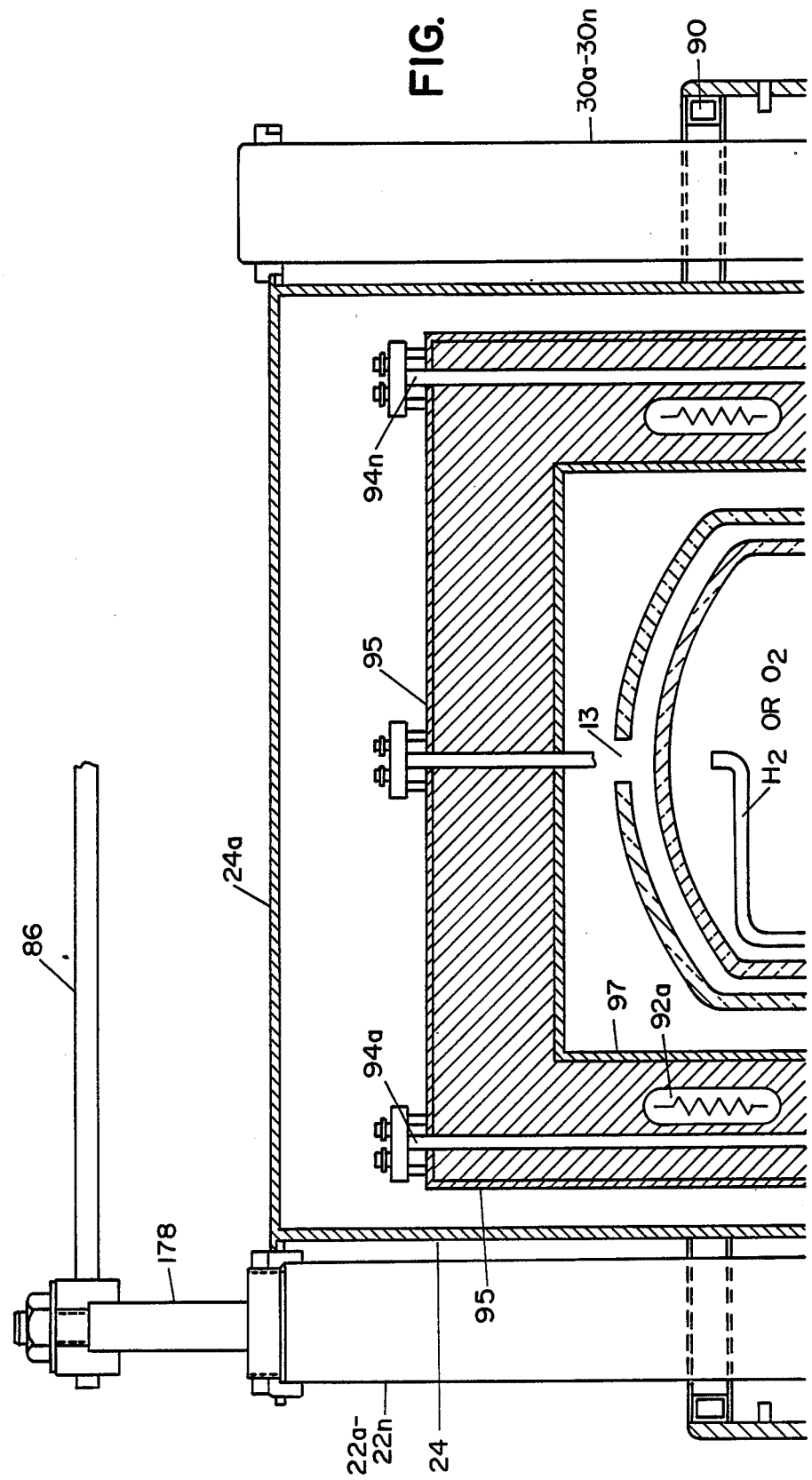

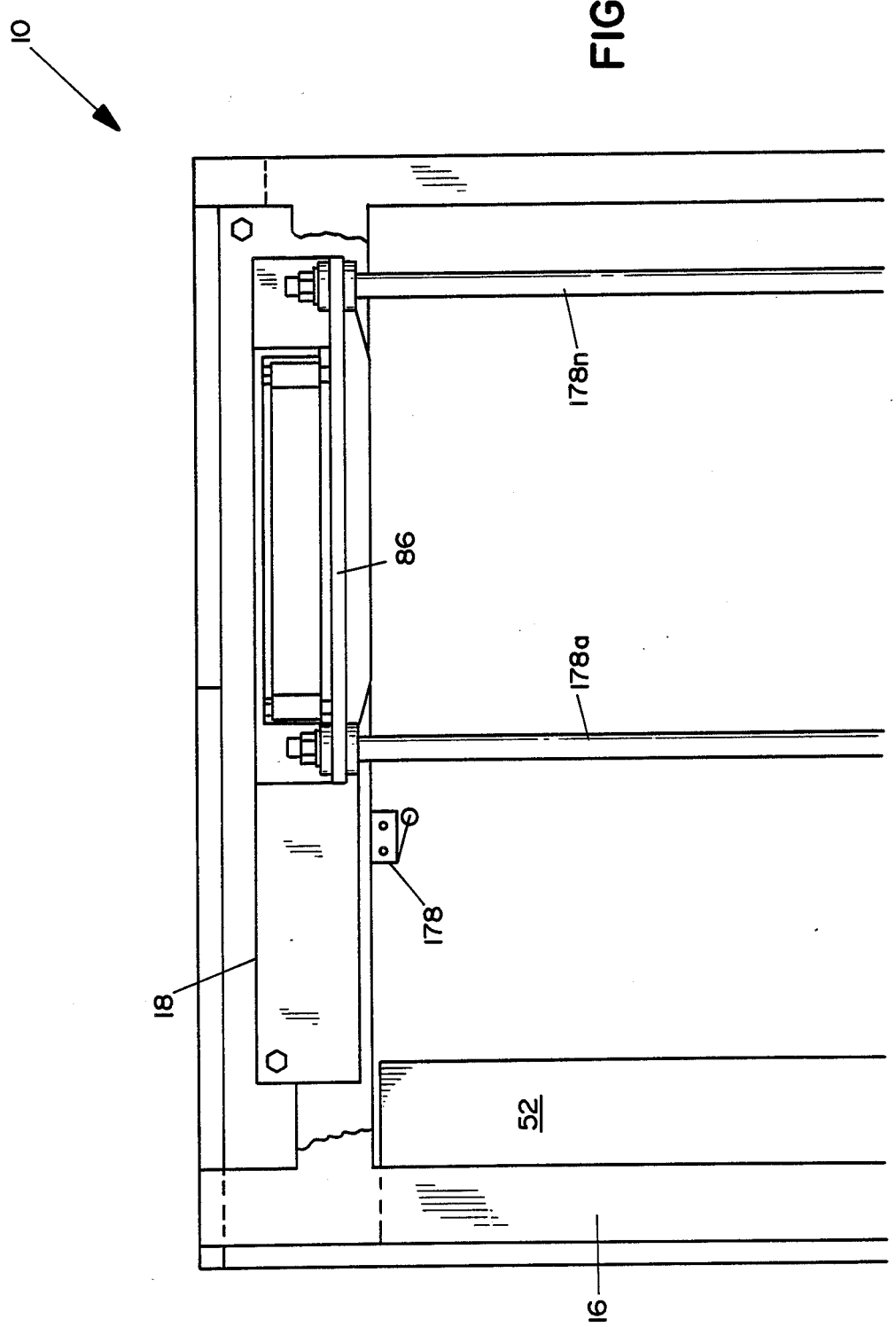

VALVE LOGIC TABLE

| COND. | | DESCRIPTION | VALVE NUMBER | | | | | | | | |
|---|---|---|---|---|---|---|---|---|---|---|---|
| | | | 218 | 212 | 230 | 232 | 216 | 210 | 228 | 208 |
| 1 | 14, 12, 80, 32/34, 34 | NO MOTION ANY POSITION (ALL MOTION CEASES) | C | C | C | C | C | C | O | C |
| 2 | 14, 12 | RAISE FURNACE 14 & PROCESS TUBE 12 | C | C | O | C | C | O | O | O |
| 3 | 14, 12, 34 | RAISE FURNACE 14 ONLY | C | O | C | O | C | C | O | O |
| 4 | 14, 12, 34 | RAISE PROCESS TUBE 12 ONLY | C | O | O | C | C | C | O | O |

| | | | | | | | | | |
|---|---|---|---|---|---|---|---|---|---|
| 5 | LOWER PROCESS TUBE 12 ONLY | C | O | C | C | O | C | C | O |
| 6 | LOWER FURNACE 14 ONLY | O | C | O | O | O | C | C | O |
| 7 | LOWER FURNACE 14 AND PROCESS TUBE 12 | C | C | C | O | C | O | O | O |
| 1a | SHUT DOWN-AIR OFF (PROCESS TUBE 12 AND FURNACE 14 DOWN) | C | C | C | C | C | C | O | O |
| 1b | READY TO OPERATE, AIR ON (PROCESS TUBE 12 AND FURNACE 14 DOWN) | O | O | C | O | C | O | O | C |

C=CLOSED   O=OPEN

NOTE: VALVES 208 AND 228 ARE NORMALLY OPEN.
VALVES 210, 212, 216, 218, 230 AND 232 ARE NORMALLY CLOSED.

VERTICAL THERMAL PROCESSOR

CROSS REFERENCES TO CO-PENDING APPLICATION

BACKGROUND OF THE INVENTION

1. Field of the Invention

The present invention relates to a diffusion furnace and, more particularly, pertains to a microprocessor controlled vertically oriented thermal processor, also known as a diffusion furnace, for the processing of silicon or gallium arsenide wafers or substrates where vertically positionable furnace and process tube elements coaxially position, forming a double bell jar like contaminant free processing chamber.

2. Description of the Prior Art

The prior art diffusion furnaces have been horizontally oriented where uniform and quality products where influenced by variable factors including time, temperature, temperature ramp up rates, cool down rates, density of load, the size of the wafer, gas flow and concentration and temperature levels within the process chamber. Horizontal furnaces were not readily capable of high pressure oxidation or silicon deposition without special design, and often would not produce the quality levels desired. If high quality was attainable, the range of applications for the device was somewhat limited.

Prior art vertical furnaces were hindered by excessive process cool-down times, excessive maintenance, inaccessability of parts, particulate contamination, and other numerous reasons.

The present invention overcomes the disadvantages of the prior art by providing a microprocessor controlled vertical thermal processor including a double bell jar like assembly incorporated in a furnace with a vertically positionable furnace with an internal bell jar or element tube placed coaxially over another vertically positionable bell jar or process tube.

SUMMARY OF THE INVENTION

The general purpose of the present invention is to provide a vertical thermal process furnace to process integrated circuit silicon or gallium arsenide wafers or substrates where moveable furnace elements and internal processing areas are vertically positionable with respect to each other. Pneumatic actuating cylinders position a cylindrical vertically oriented furnace over and about a bell jar like process tube in which silicon or gallium arsenide wafers or substrates are processed in a temperature controlled thermic zones. The process tube is positioned vertically by pneumatic actuating cylinders, and each of the sets of pneumatic cylinders moves independently of each other to provide for proper controlled cooling and heating. Provisions are made for pneumatically raising the furnace and bell jar like process tube, and also for sliding each from a cabinet enclosure to an external position for maintenance and other change over functions.

The terms silicon wafers, gallium arsenide, substrates, masks or disks is by way of example and for purposes of illustration only, and is not to be construed as limiting of the present invention.

According to one embodiment of the present invention, there is provided an overhead sliding track supporting a furnace which is fixed thereupon by a plurality of pneumatic actuating cylinders for vertical positioning of a furnace. Another plurality of cylinders are positioned about the furnace to raise and lower a double ring assembly including a quartz bell jar like process tube with spaced reference to the furnace and a base plate. A pnuematically sealed load door on the front cabinet panel provides loading access to the load zone so that a silicon wafer load on a quartz boat or the like can be positioned on a pedestal for processing when the furnace and process tube are positioned in a full upward position, after which the furnace and process tube are lowered as illustrated for processing. Microprocessor control panels are positioned on the front cabinetry and inside of the rear access door for multi-station control.

One significant aspect and feature of the present invention, the vertical thermal processor, is a vertically positionable furnace including an inner bell jar like element tube which positions over and about a vertically positionable bell jar like process tube.

Another significant aspect and feature of the present invention is a furnace with a process tube which slides from the cabinet housing enclosure to the outside of the cabinet housing enclosure for maintenance of the furnace and process tube, and exterior to the enclosure for maintenance of interior elements such as a base plate fixture.

Another significant aspect and feature of the invention is a furnace for rapid ramping up or ramping down of process tube and load temperature.

A further significant aspect and feature of the present invention is the double lift of the furnace and the quartz bell jar providing for removal of the heating element without affecting the controlled atmosphere. This provides for very rapid ramp down of temperature at the conclusion of an operation. predetermined atmosphere control. This provides process ambient control before, during and after heating.

Having thus described embodiments of the present invention, it is the principal object hereof to provide a vertical thermal processor which features a movable furnace and moveable process tube elements for the rapid and precise control of thermic processes for use in the processing of integrated circuit silicon or gallium arsenide wafers or substrates.

Another object of the present invention is to provide a vertical thermal processor including sliding track members for rapid removal of the furnace and process tube for purposes of maintenance or process changeover.

Another object of the present invention is a microprocessor controlled vertical thermal processor, especially being compatible for robotic usage.

Another object of the present invention is to provide a contamination free thermic zone by the use of a double bell jar like arrangement.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIGS. 3A, 3B, 3C illustrate a view in cross section of the furnace engaged over the quartz process tube;

FIGS. 5A, 5B, 5C illustrate a cutaway side view of the vertical thermal processor;

DESCRIPTION OF THE PREFERRED EMBODIMENTS

Figure 1:
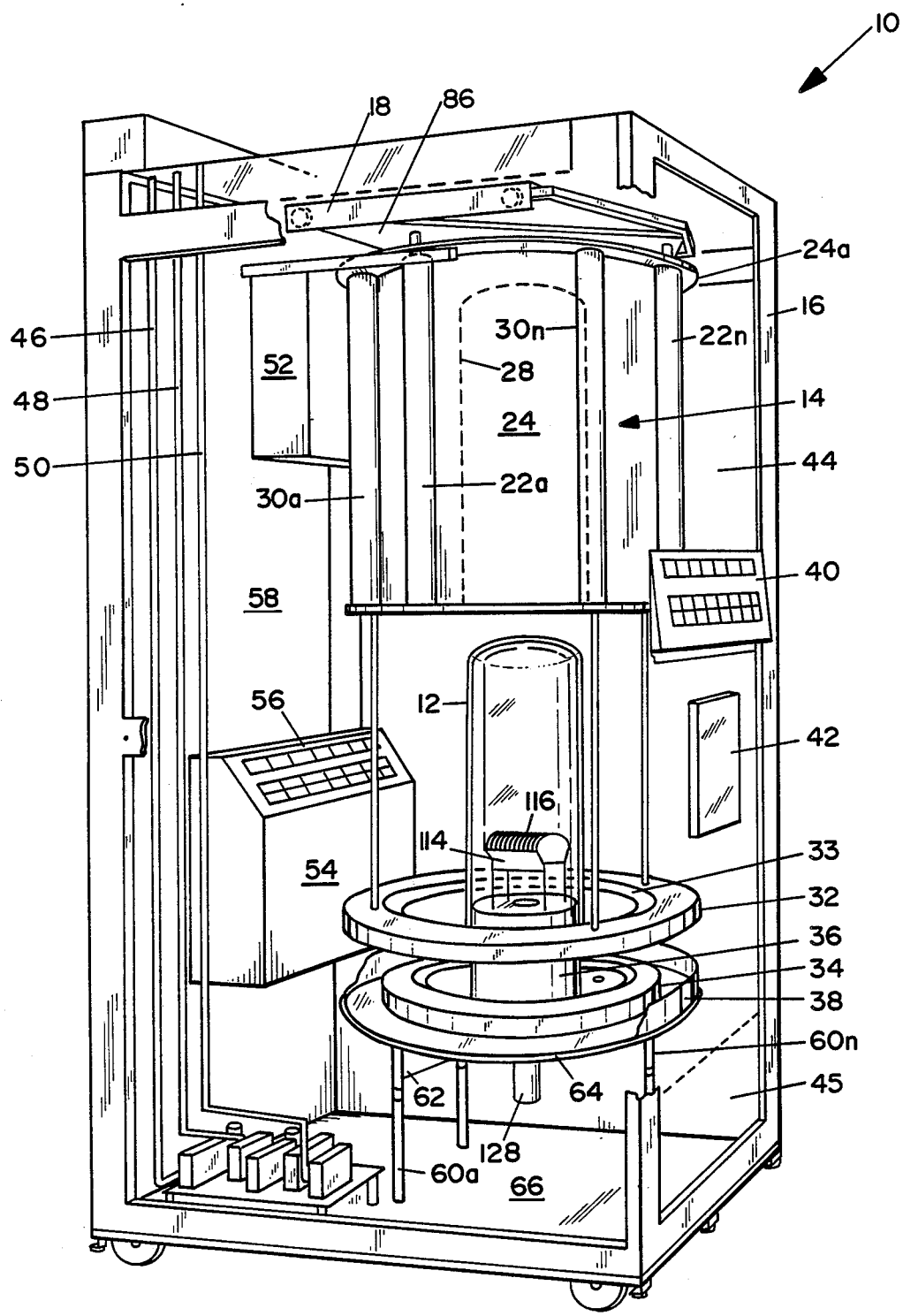
FIG. 1 illustrates a perspective cutaway view of the vertical thermal processor, the present invention.

FIG. 1 illustrates a vertical thermal processor 10, also known as a furnace, for the processing of integrated circuit silicon or gallium arsenide wafers or substrates including a pneumatically vertically positionable bell jar like quartz process tube 12 and a pneumatically vertically positionable furnace 14, both of which fit coaxially in various independent vertical configurations with respect to each other to facilitate loading, processing, cooling and cleaning of the elements. The quartz process tube 12 and the furnace 14 are positioned within a configured framework 16 and are supported on a multi-channel overhead slide mechanism 18, similar to a drawer slide, so that the quartz process tube 12 and the furnace 14 may be independently lifted and transported by the overhead slide mechanism 18 for routine maintenance and cleaning external to the cabinet enclosures as later described in detail.

A plurality of actuator cylinders 22a-22n position axially about a canister shield 24 of the furnace 14 to vertically position the furnace 14, the canister shield 24, a contained ceramic furnace heater element 26, as illustrated on FIG. 3B, and a bell-jar shaped furnace liner tube element 28 as described later in detail in FIGS. 4 and 7. Another plurality of pneumatic process tube actuator cylinders 30a-30n are positioned about the canister shield 24 of the furnace 14 to vertically position an outer process tube lift ring 32 and an inner process tube lift ring 33 containing the quartz process tube 12. A water-cooled base plate 34 and a firing pedestal 36 position centrally in a load cavity shroud 38. An electronic control panel 40 is positioned on the upper front panel 44. A pneumatically sealed load door 42 is positioned on the lower cabinet front panel 45, as illustrated in FIGS. 5A, 5B, and 5C. Pressurized nitrogen is supplied through pressured nitrogen supply line 46 for a pneumatic cylinder operation and purging of the processor. Process oxygen and hydrogen are supplied through supply lines 48 and 50, respectively, for connection to components on plate 184 as described later in detail with respect to FIGS. 8 and 10. A pneumatic panel 52 is positioned in the upper rearward portion of the cabinet and adjacent to the canister shield 24 to control pneumatic pressure to actuating cylinders 22a-22n and 30a-30n, as well as other pneumatic devices as illustrated in detail in FIG. 7. A computer card rack 54 and auxiliary control panel 56 are positioned on the rear bottom cabinet access door 58. A plurality of adjustable mounting posts 60a-60n are positioned between a V-frame 62, a gas panel shield 64 and the bottom cabinet panel plate 66 to support the base plate 34, gas panel shield 64 and associated components.

Figure 2:
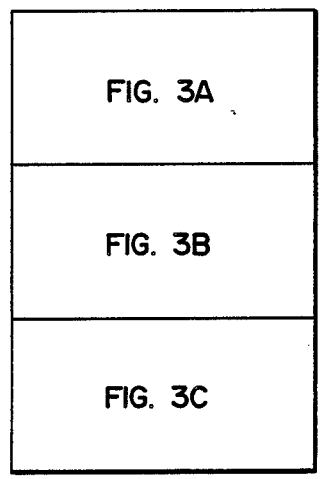
FIG. 2 illustrates the positioning of FIGS. 3A, 3B, and 3C in combination.
Figure 3B:
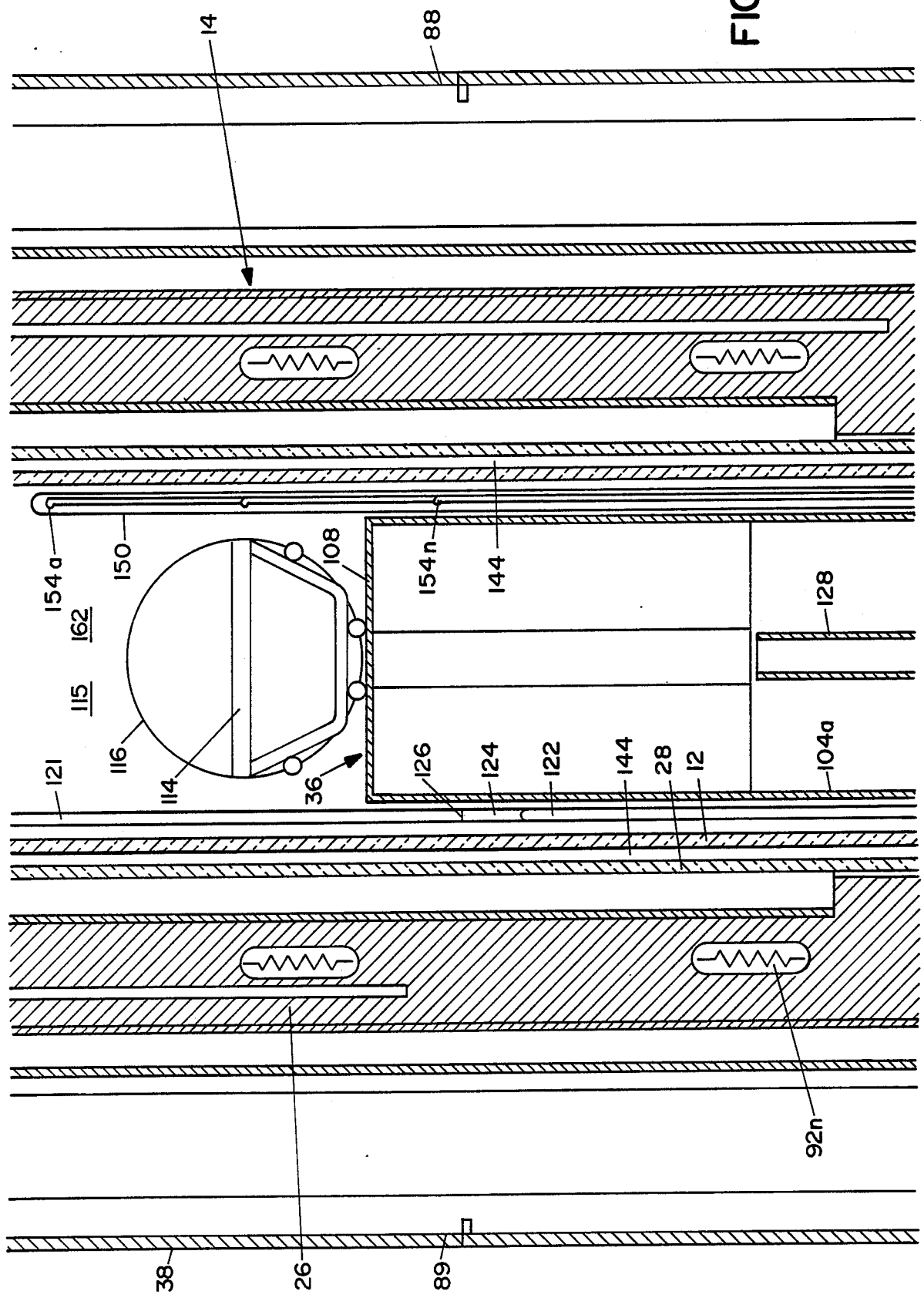
Figure 3C:
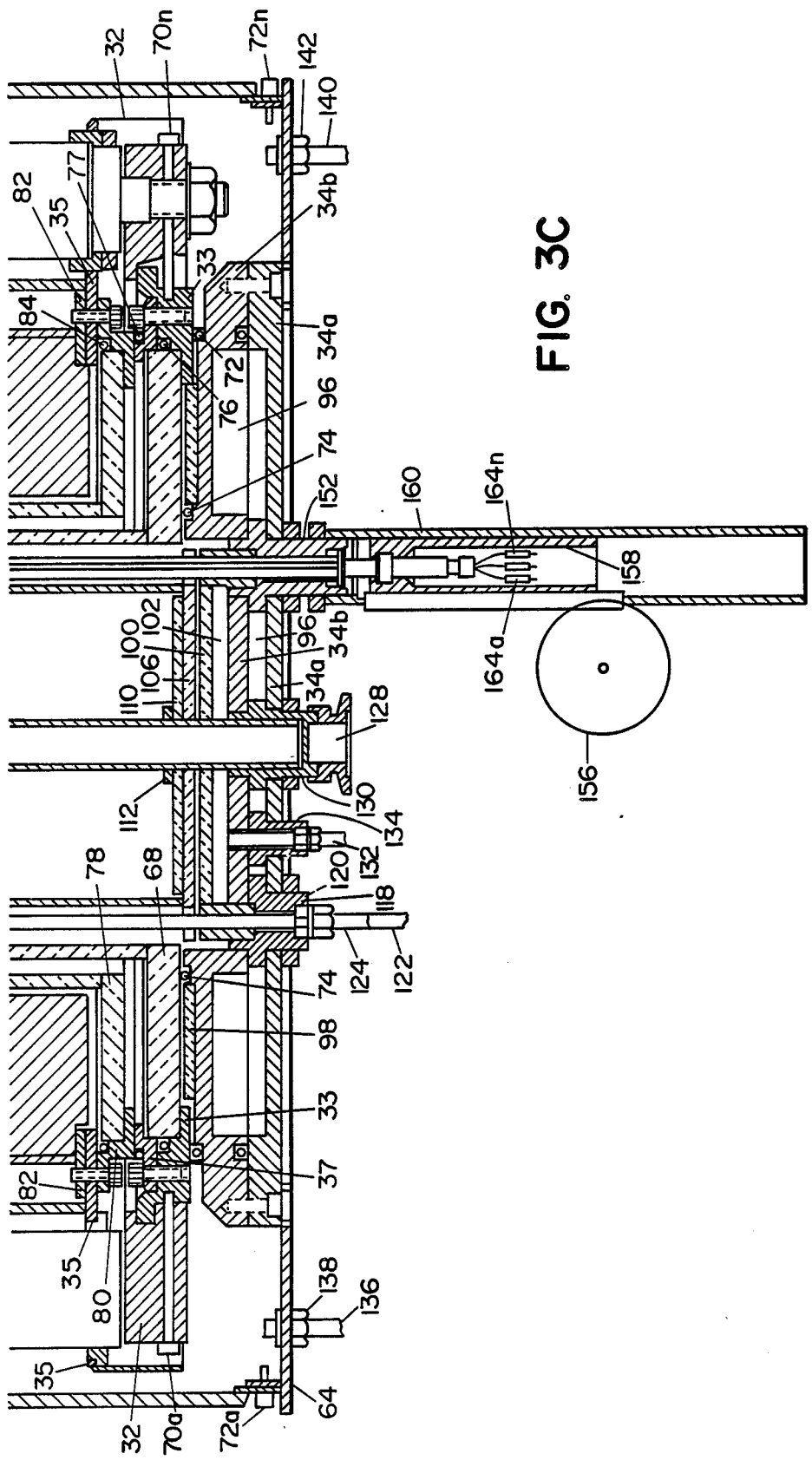

FIG. 2 illustrates the placement of the sheets of drawings of FIGS. 3A, 3B, and 3C.

FIGS. 3A, 3B, and 3C illustrate a side view in cross section of the furnace engaged over the quartz process tube where all numerals correspond to those elements previously described. The quartz bell jar process chamber 12, is positioned on a circular quartz ring 68, as also illustrated in FIGS. 5A, 5B, and 5C. The quartz ring 68 is positioned on an inner process tube lift ring 33 which is correspondingly positioned within an outer process tube lift ring 32 concentric to the quartz ring 68 and quartz process tube 12. A quartz ring keeper ring 37 is positioned on the inner process tube lift ring 33 to secure the process tube quartz ring 68 and process tube 12 to the inner process tube lift ring 33. A plurality of removable pins 70a-70n secure the outer process tube lift ring 32 to the inner process lift ring 33 to facilitate removal and cleansing of the quartz process tube 12 external to the vertical thermal processor housing as described later in detail. The outer and inner process tube lift rings 32 and 33 are positioned on O-ring seals 72 and 74, respectively, over and about the water-cooled base plate 34. An additional seal 76 is positioned between the inner quartz process tube lift ring 33 and the process tube quartz ring 68 for inner chamber integrity. The process tube lift cylinders 30a-30n secure at the canister shield top plate 24a and lower canister flange ring 35 to engage against the outer lift ring 32, and to provide for vertical positioning of the outer lift ring 32, the inner lift ring 33, the process tube quartz ring 68, and the quartz process chamber 12 relative to the water-cooled base plate 34.

The vertically positionable furnace 14 includes, but is not limited to, a bell shaped element tube or furnace liner 28, a ceramic heater 26 positioned on and secured to the element tube quartz ring 78, a heater element lift ring 80, canister flange ring 35, and a heater element positioning ring 82, all of which position concentrically and coaxially to the quartz process tube 12. The element tube quartz ring 78 positions within element lift ring 80 with an O-ring seal 84 therewithin. Canister flange ring 35 is positioned over the heater element lift ring 80 to facilitate securement of the canister shield 24 to the heater element lift ring 80. O-ring seal 84 also seals with flange ring 35, as well as with the element tube quartz ring 78 and element lift ring 80. An O-ring seal 77 is positioned between the heater element lift ring 80 and the quartz ring keeper ring 37. The heater element positioning ring 82 is positioned over the flange ring 35 for centering and containment of the ceramic heater element 26 along the vertical axis of the furnace 14. The stationary ends of the canister-furnace actuator cylinders 22a-22n affixes to the upper canister shield 24a. The other end affixes to the flange ring 35 while the actuating rods position in an overhead yoke 86 in the overhead sliding track mechanism 18, as illustrated in FIG. 1, and as also illustrated in FIGS. 5A, 5B and 5C, to vertically position the canister 24 and the furnace 14 with respect to the quartz process tube 12 and the water-cooled base plate 34.

The cylindrical load cavity shroud 38, including a front loading cutout 88 and rear loading cutout 89, position over and about the cylinders 22a-22n, 30a-30n, the canister shield 24, the vertically positionable furnace 14, and the quartz bell jar like process tube 12, as illustrated in FIG. 1. An inflatable seal 90 is positioned at the upper portion of the load cavity shroud 38 expands radially to engage with the canister shield 24 during loading and unloading of the silicon or gallium arsenide wafers or substrates, thus providing for a contamination free center portion of the vertical thermal processor 10.

A plurality of resistance wire heaters 92a-92n and a plurality of thermocouple elements 94a-94n position in the ceramic heater element 26 to sense and control the temperature of the ceramic heater. The heater element is surrounded by a stainless steel shroud 95. The interior is lined with a heat resistant and resilient protective layer 97 of zirconia oxide to impede metallic contaminant immigration. A water-cooled base plate 34 includes a bottom portion 34a, a top portion 34b, and a water chamber 96 therebetween. A quartz heat shield plate ring 98 is positioned over and above the upper base plate 34b, and below the process tube quartz ring 68. An additional circular quartz heat shield plate 100 is positioned over and above the central region of the upper water-cooled base plate 34b and provides a central atmospheric chamber 102. A multi-sided quartz firing pedestal 36, including walls 104a-104n, a quartz bottom 106, and a quartz top 108, is positioned over the circular base quartz shield 100 and extends upwardly into the mid-portions of the quartz process tube 12. A pedestal bottom quartz heat shield 110 fits over the pedestal bottom 106 and is retained by a ring 112.

A wafer boat 114 and silicon or gallium arsenide wafers or substrates 116 are illustrated as positioned in the load chamber 115 and within the process tube 12 for processing. The load chamber 115 generally is the area contained by the load cavity shroud, and is adjacent to the load door 42 as illustrated in FIGS. 5A, 5B, and 5C. Process hydrogen and oxygen enter the quartz process tube 12 via fittings 118 and 120, and through supply tubes 122 and 124, as also illustrated in FIG. 6, to plumb together in a common port 126 where the process gases are injected into the interior of the process tube 12. An elevated purge tube 121 enters the quartz process tube 12 via fitting 123 in base plate 34, as also illustrated in FIG. 6. An exhaust tube 128 positions centrally, as illustrated, and passes outwardly via a through fitting 130 and to a vacuum source whereby exhaust particles are evacuated from the interior of the process tube 12. A gas purge inlet port 132 and a fitting 134 are positioned in the base plate 34 to provide for purging of the quartz process tube 12. An additional purge inlet 136 and fitting 138 are positioned in the base plate in conjunction with a purge outlet 140 and fitting 142 for purging of the area 144 between the process tube 12 and the element tube 28. A quartz thermocouple tube 150 is positioned through a fitting 152 in the base plate 34. A plurality of thermocouples 154a-154n are positioned interiorly to the quartz thermocouple tube 150, and are positioned vertically in periscope style within the quartz thermocouple tube by an actuator 156 acting upon a base rod 158 in a shroud tube 160 to sense temperature data within the isothermic zone 162 for computer temperature control within desired parameters of $+/-0.5°$ C. Thermocouple leads 164a-164n position in the thermocouple base rod 158 for computer temperature analysis.

Figure 4:
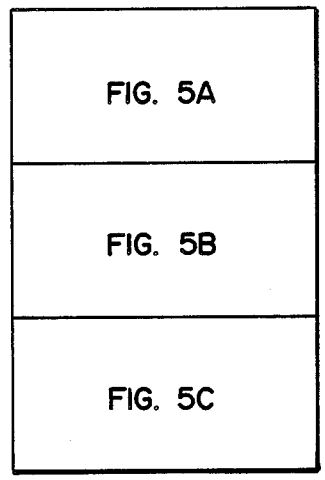
FIG. 4 illustrates the positioning of FIGS. 5A, 5B and 5C in combination.
Figure 5B:
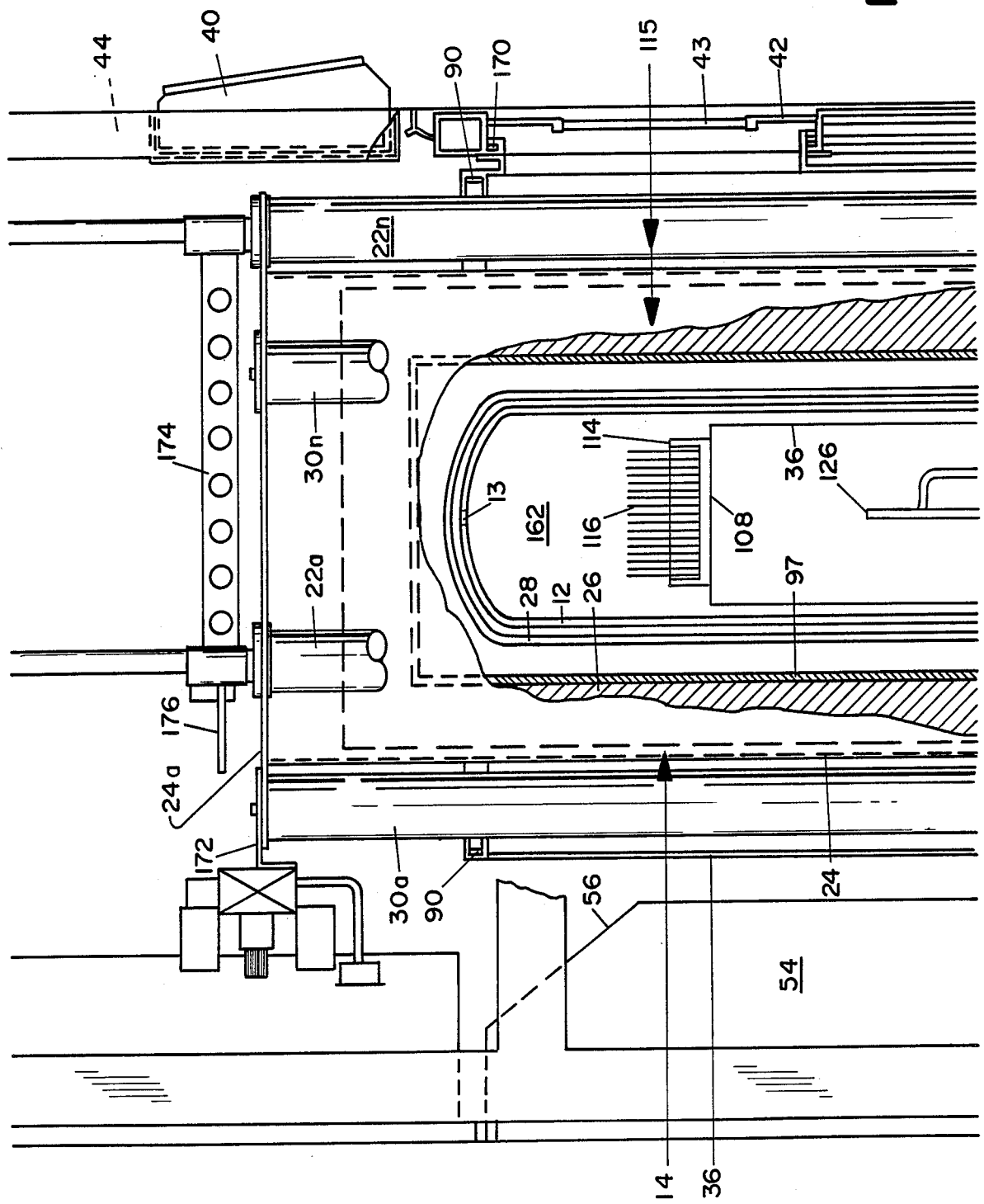
Figure 5C:
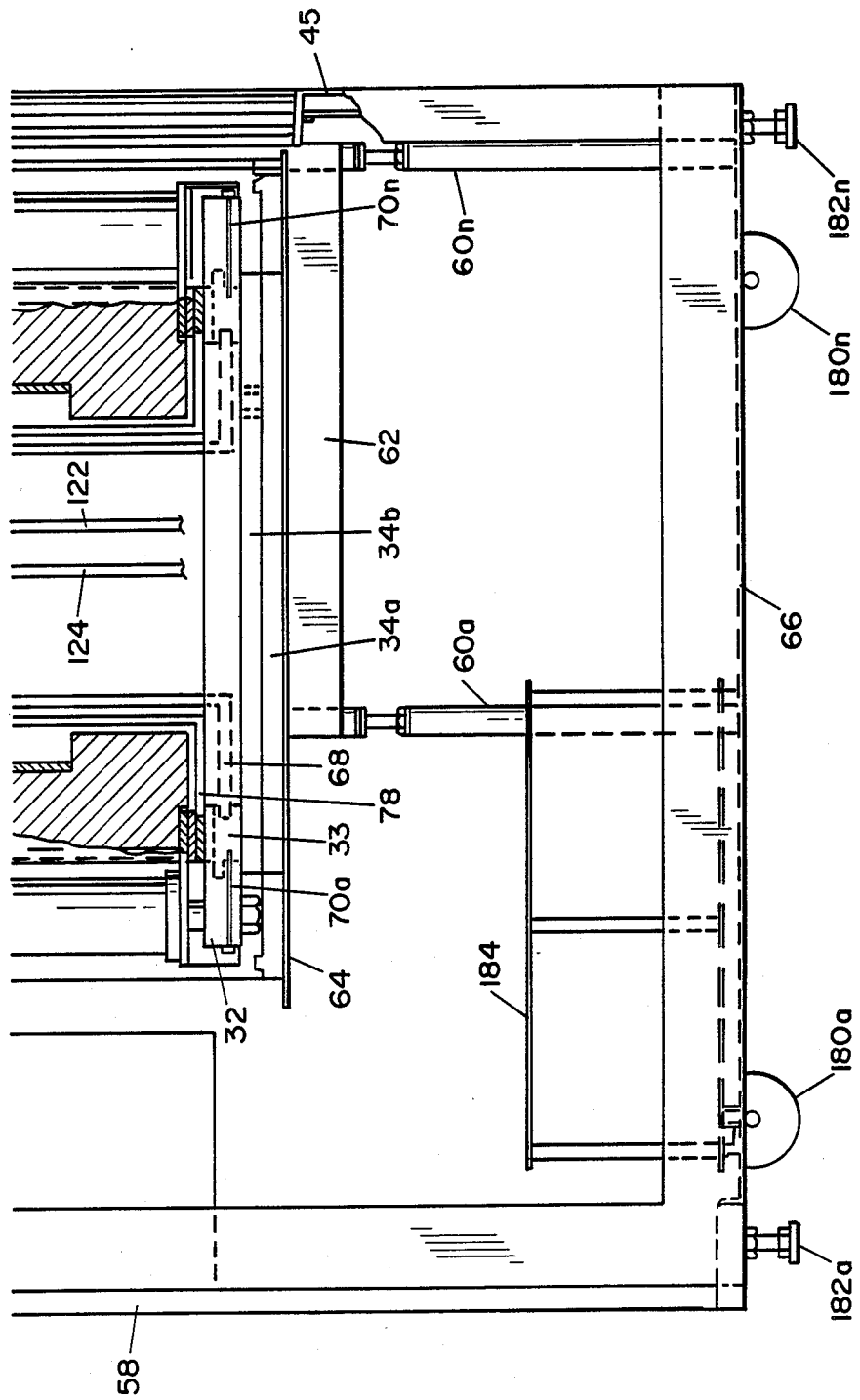
Figure 6:
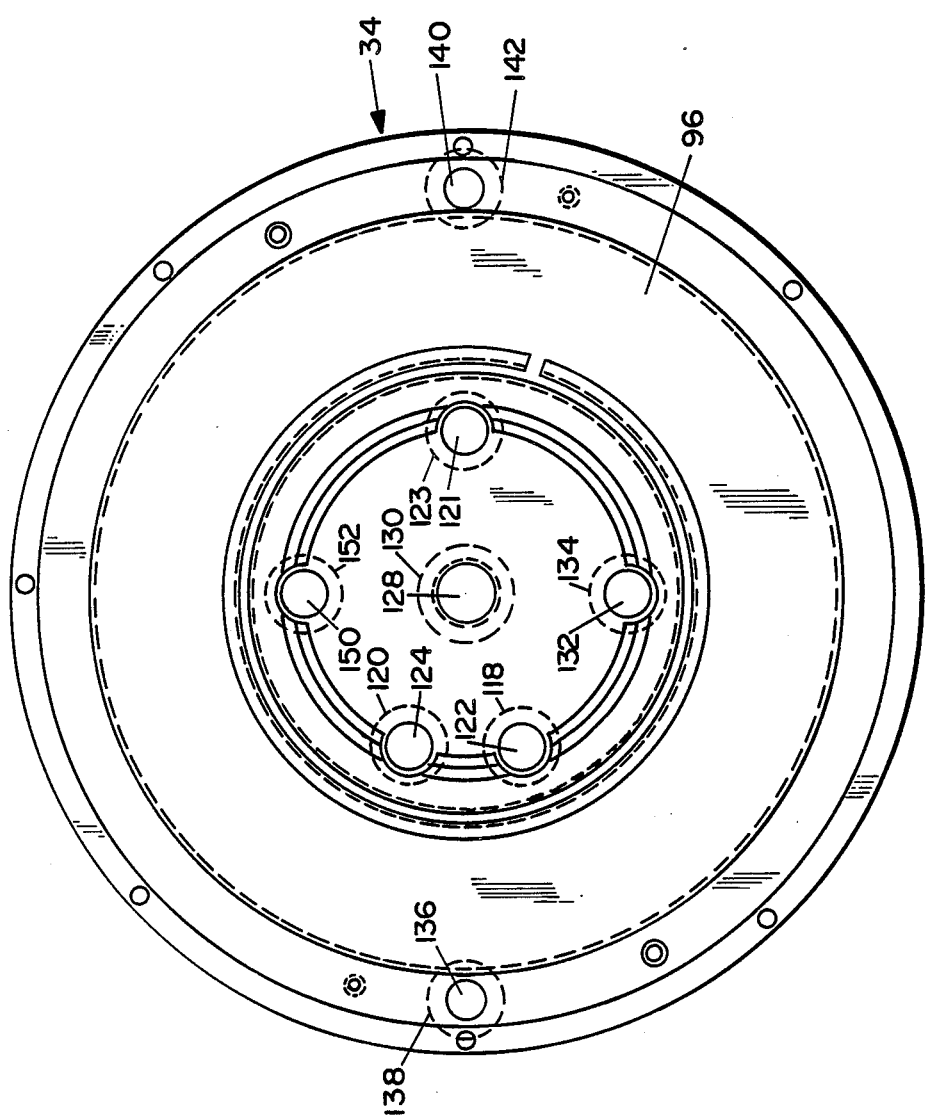
FIG. 6 illustrates a top view of the base plate and orifices.

FIG. 4 illustrates the placement of the sheets of the drawings of FIGS. 5A, 5B, and 5C.

Figure 8:
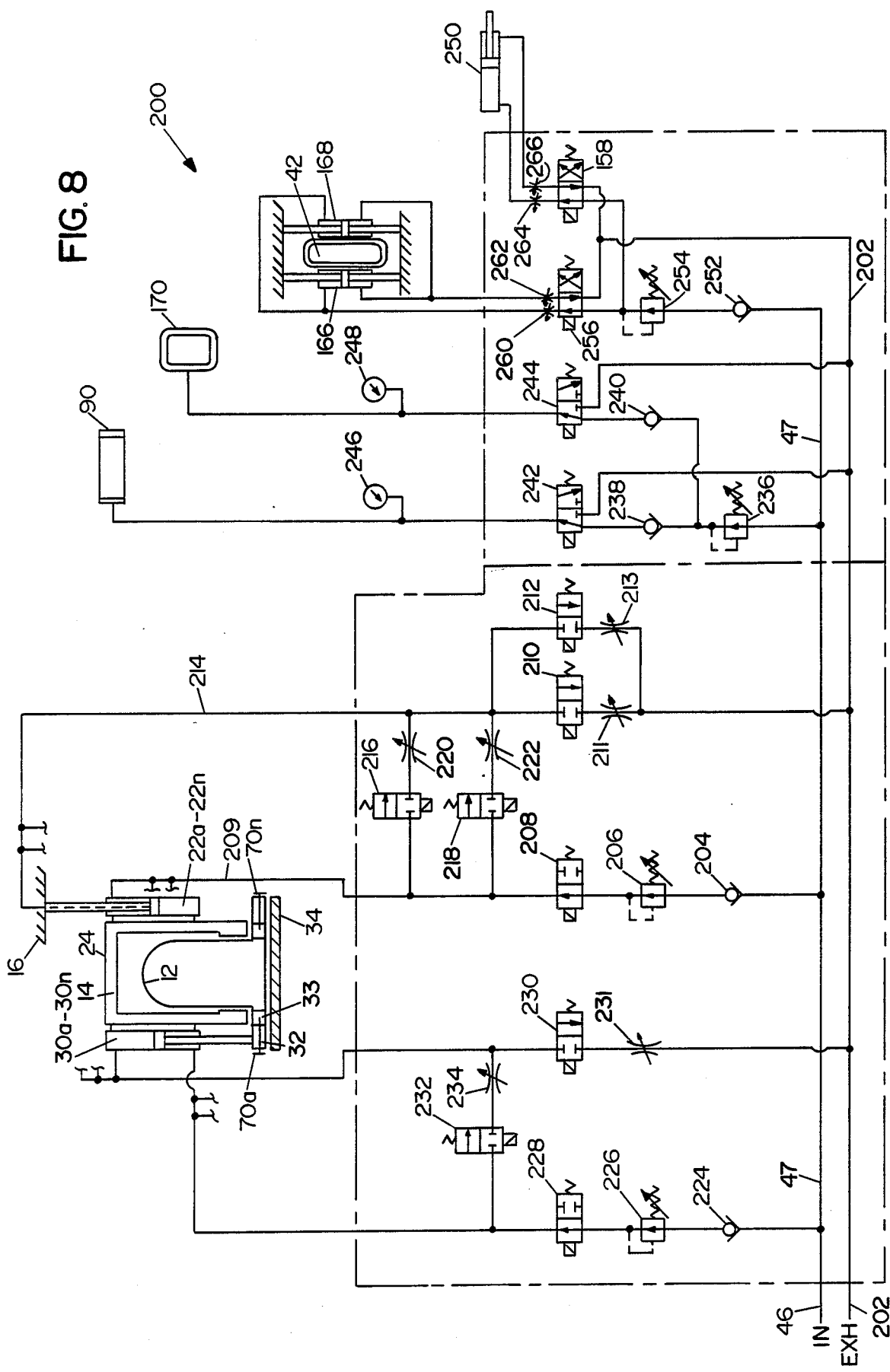
FIG. 8 illustrates a pneumatic schematic diagram of the vertical thermal processor.

FIGS. 5A, 5B, and 5C illustrate a cutaway side view of the vertical thermal processor 10 where all numerals correspond to those elements previously described. The sliding pneumatically actuated load door 42 with a window 43 slides vertically to allow a robotic arm or other access to the isothermic zone 162 and load zone 115 for loading and placement of a wafer boat 114 on the quartz pedestal 36 when the furnace 14 and process tube 12 both have been positioned to the raised position by means of pneumatic cylinders 22a-22n and 30a-30n. The load door 42 is actuated upwardly or downwardly by parallel load door actuators 166 and 168 as depicted in FIG. 8. A pneumatic door seal 170, around and about the load door 42, provides for inner chamber integrity during thermic processing. Pneumatic valves, regulator gauges and a pneumatic manifold position on a bracket 172 on the rearward portion of the canister shield top plate 24a. The function of these pneumatic components is described in detail in FIG. 10. A canister lift spacer bar 174, including a canister lift stop 176, is positioned over and about canister and furnace lift cylinder actuator rods 178a-178n. The canister and furnace lift stop 176 engages a limit switch 178 during normal operation to limit the upward movement of the canister 24 containing the furnace 14. The canister and furnace lift spacer bar 174 including the canister and furnace lift stop 176 is removed when it is desirable to lift the canister 24, the furnace 14 and process tube 12 as a combined unit over and above the upper level of the load cavity shroud 36 so that the entire unit may be slid rearwardly and out of the cabinet by the overhead slide mechanism 18 for cleaning, replacement or maintenance functions. In this instance, the canister shield 24a contacts a limit switch 178 to limit the upward movement of the canister 24, furnace 14 and process tube 12 combined unit. A detailed description of pneumatic cylinder actuation and valve positioning is described later in detail in FIGS. 8 and 9. Adjustable support legs 60a-60n position between the cabinet bottom plate 66 and the v-support frame 62 to support and align the gas panel shield 64, base plate 34 and their attendant members. A plurality of wheels 180a-180n and a plurality of adjustable levers 182a-182n position about the lower portion of configured frame 16. A gas manifold support plate 184 positions on the cabinet bottom plate 66 to accommodate gas and nitrogen inlet valves and controls. These valves and controls are later described in detail in FIGS. 8, 9 and 10.

FIG. 6 illustrates a top view of a typical base plate and orifices where all numerals correspond to those elements previously described.

Figure 7:
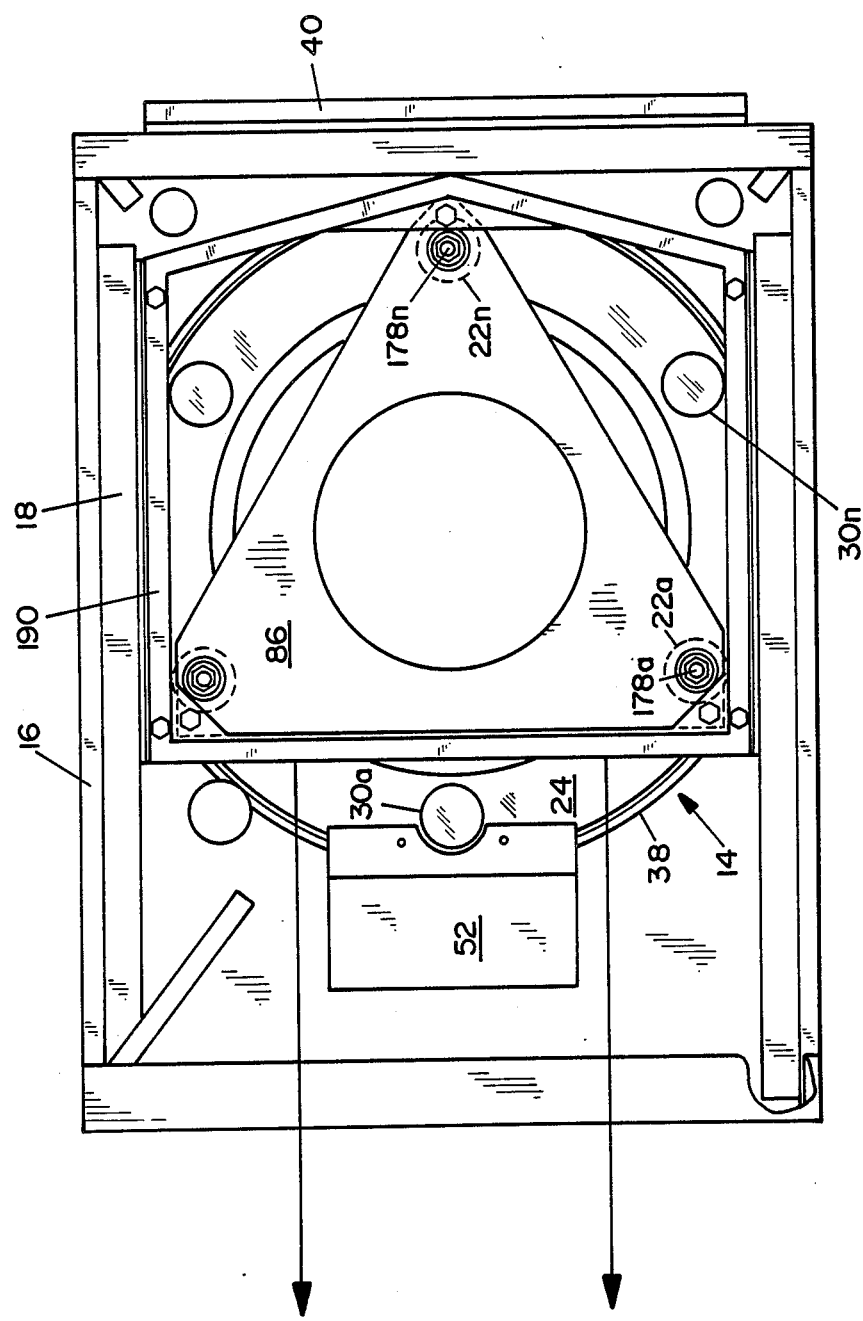
FIG. 7 illustrates a top view of the vertical thermal processor slide mechanism.

FIG. 7 illustrates a top view of the vertical thermal processor slide mechanism where all numerals correspond to those elements previously described. The overhead slide mechanism 18 is positioned interiorally to the configured frame 16. A support framework 190 is secured to the slide mechanism 18. Triangular yoke 86 is secured to the framework 190, and is also the attachment point for the ends of the pneumatic actuator rods 178a-178n of pneumatic actuators 22a-22n. When the canister 24, furnace 14 and process tube 12 move as a unit outside of the confines of framework 16, the yoke 86, support frame 190 and the canister 24, the furnace 14 and process tube 12 as a unit slide outwardly on the slide mechanism 18 to a position exterior to the cabinet for cleaning, maintenance or for other procedures.

FIG. 8 illustrates a pneumatic diagram 200 of the vertical thermal processor 10. The pneumatic actuating cylinders 22a-22n secure to the frame 16 to vertically position the canister 24 and the furnace 14 unit over the quartz process tube 12 and also with respect to the base plate 34. The process tube actuators 30a-30n secure on the canister 24 and the furnace 14 unit to vertically position the process tube 12, including the outer and inner process tube lift rings 32 and 33, respectively, with respect to the canister 24, the furnace 14 unit and/or the base 34. An external pneumatic source containing pressured nitrogen attaches to the pneumatic tube 46 for distribution through a nitrogen manifold 47 and an exhaust manifold 202 ports relief pressures overboard. Pressurized nitrogen from the line 46 and the nitrogen manifold 47 flows through check valve 204, pressure regulator 206, a 2-way universal valve 208 and pressure line 209 to pressurize the top side of canister and furnace lift actuators 22a-22n. Parallel 2-way universal valves 210 and 212, and restrictors 211 and 213 position in the return line 214 between canister and furnace lift actuators 22a-22n and the exhaust manifold 202. Paralleled 2-way universal valves 216 and 218 with corresponding restrictor valves 220 and 222 position across the pressure line 209 and the return line 214. Pressurized nitrogen flows through check valve 224, pressure regulator 226, 2-way universal valve 228 and to the bottom side of the process tube lift cylinders 30a-30n. A 2-way universal valve 230 and a restrictor 231 position between the top side of the quartz process tube lift actuator 30a-30n and exhaust manifold 202. A 2-way universal valve 232 and restrictor valve 234 position across the top side and bottom side of the process tube lift actuators 30a-30n. The process chamber 12 and the canister 24/furnace 14 unit can be positioned in various positions with relationship to each other and/or the base plate 34 by the actuation valves 208, 210, 212, 216, 218, 228, 230 and 232 as depicted and as illustrated with reference to the valve logic table on FIG. 9.

Pressurized nitrogen is supplied from manifold 47 to pressure regulator 236, check valves 238 and 240, universal 3-way valves 242 and 244 to shroud seal 90 and load door seal 170 as illustrated. Pressure gauges 246 and 248 monitor pressure at the shroud seal 90 and the load door seal 170, respectively. Nitrogen pressure is supplied to the load door actuators 166 and 168 and a safety interlock cylinder 250 from pressurized nitrogen manifold 47 through a check valve 252, a pressure regulator 254, a 4-way valve 256, and a 4-way valve 258 as illustrated. Needle valves 260, 262, 264, and 266 position accordingly to provide for metering of nitrogen pressures for the proper actuation rate of the load door actuators 166 and 168, and the safety interlock cylinder 250.

Figure 9A:
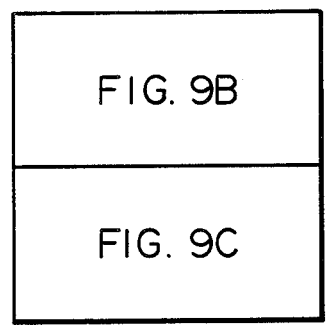
FIG. 9 illustrates a pneumatic valve logic table.

FIG. 9 illustrates a pneumatic valve logic table for the vertical operation of the canister 24 and furnace 14 unit, the quartz process tube 12 and the associated elements thereof, where all numerals correspond to those elements previously described.

Figure 10:
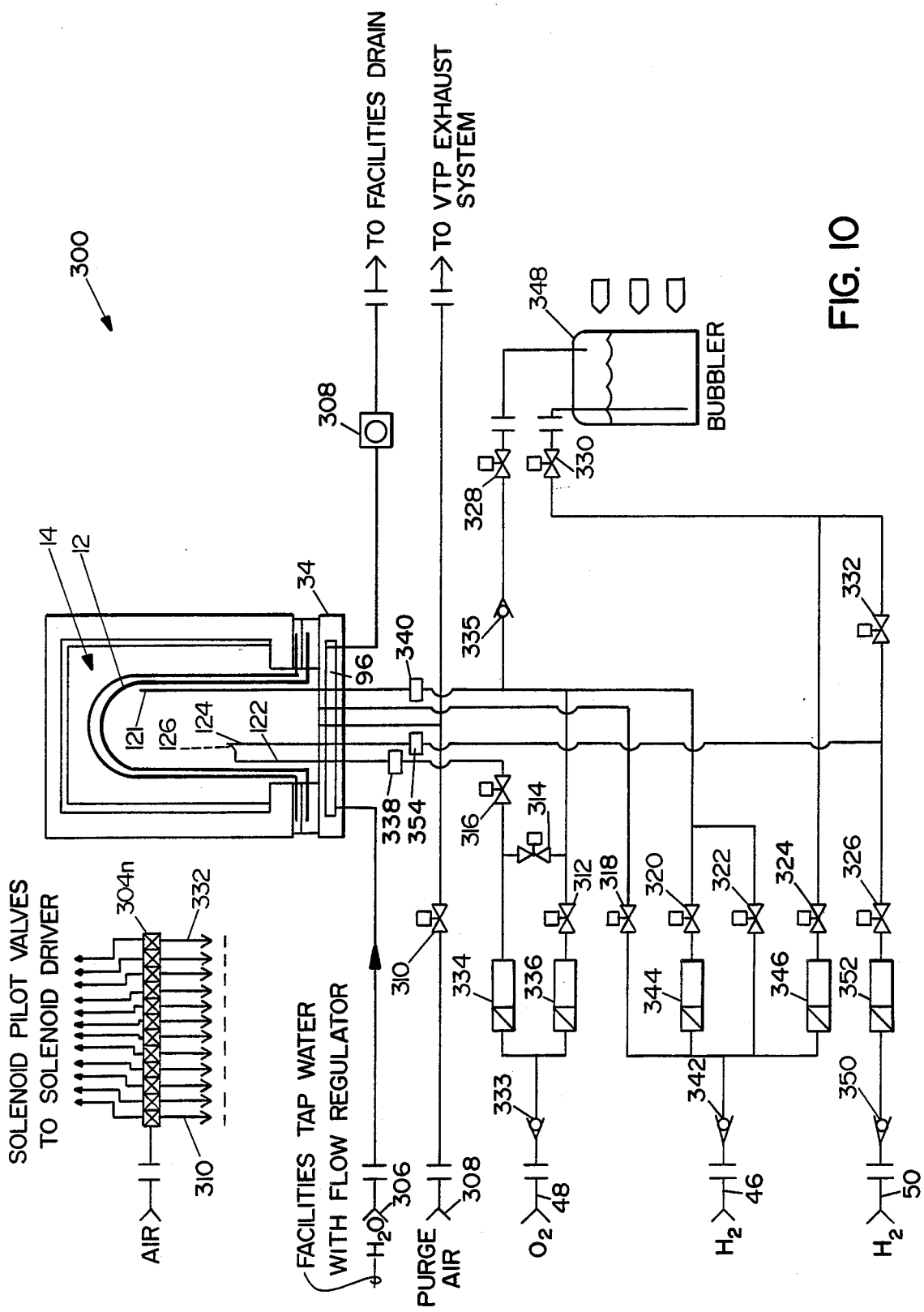
FIG. 10 illustrates a process gas and water flow schematic for the vertical thermal processor; and, FIG. 11 illustrates an electrical block diagram for the vertical processor.

FIG. 10 illustrates a process gas and water flow schematic 300 for the vertical thermal processor 10 where all numerals correspond to those elements previously described. An air or nitrogen source 302 operates a bank of computer controlled solenoid pilot valves 304a-304n to pneumatically actuate air purge and gas control valves 310-332 as described in this figure. Cooling water 306 flows through the water jacket 96 in base 34 and through a flow fault indicator 308 to an external facility drain 309. Purge air is controlled by valve 310 for purging of the exhaust tube 128, as also illustrated in FIG. 3B, vacuum line exhaust. Process oxygen from supply tube 48 routes through a check valve 333, modulated flow controls 334 and 336, control valves 312, 314 and 316, filters 338 and into H₂ tube 122 and through a filter 340 into the elevated purge tube 121 accordingly. Purge nitrogen from the pressurized nitrogen supply line 46 passes through a check valve 342, through a plurality of valves and controls, including passage through the valve 318, the purge inlet 132, through the modulated flow control 344, the valve 320, the filter 340, into the elevated purge tube 121; through valve 322, filter 340 and into the elevated purge tube 121; and also through a modulated flow control 346, the valve 324, the valve 330 and into a bubbler 348. Process hydrogen from the supply line 50 flows through a check valve 350, a modulated flow control 352, the valve 326, a filter 354, the O₂ tube 124 and also through the valves 332 and 330 into the bubbler 348. The bubbler output flows through valve 328 and check valve 335, and is plumbed between the valve 320 and the filter 340.

FIG. 11 illustrates a block diagram electrical schematic for the vertical thermal processor, where all numerals correspond to those elements previously described.

MODE OF OPERATION

FIGS. 5A, 5B, and 5C best illustrate one mode of operation. The vertically positionable furnace 14 and quartz process tube 12 both begin in the up position. The wafer load boat 14 is inserted through the front load door 42 into the load chamber 115, and placed upon the a quartz pedestal 36. After the load door 42 is closed, the process tube 12 is lowered to rest as illustrated on the water-cooled base plate 34, and seal 170 is inflated sealing the chamber 115. The process tube 12 is then purged with nitrogen in preparation for processing. The vertically positionable furnace 14, which is at a low set point temperature, is then lowered over the process tube 12. The heater element 26 temperature is ramped up to a predetermined processing temperature, and the processing sequence proceeds. After the process sequence is completed, the heater element 26 temperature ramps down quickly due to the low mass heater element 26. The direct digital controller effects a rapid uniform cooling. On reaching a safe, slip-free temperature, a significant acceleration in temperature ramp-down rate can be achieved by raising the vertically positionable furnace 14 away from the process tube 12 and silicon wafer, gallium arsenide or substrate load 116. The silicon wafer, gallium arsenide or substrate load 116 is cooled to a predetermined or low temperature while maintaining a controlled atmosphere within the process tube 12. When the desired unload temperature is reached, the process tube 12 is raised with the wafer boat 114 and wafer load 116 contained in the sealed load chamber 115. The front door 42 is then opened, allowing the removal of the carrier load 116 of silicon or gallium arsenide wafers or substrates from the load chamber 115. A cylindrical isothermal zone 162 provides a +/−0.5° C. temperature profile anywhere in the zone. This temperature zone accepts the silicon or gallium arsenide wafers or substrates in either a vertical or horizontal orientation without loss of temperature or process control. Process gases are injected into the process tube 12 through the gas inlet tubes 122 and 124. Inlet tubes 122 and 124 are designed to minimize temperature zone perturbation, and provide a uniform gas distribution to the wafer load 116 and also assure that the gas is adequately preheated prior to reaching the thermal zone and wafers. The modular design of the vertical thermal processor provides easy access to all major assemblies, and allows all maintenance to be performed from the rear or grey room side of the system. This provides the capability of isolating all service work from the clean room.

The vertically positionable furnace 14 and process tube 12 can be rolled out of the cabinet using the drawer slide like mechanism 18. Such is accomplished without disconnecting any gas, exhaust, electrical, air or cooling water lines, allowing a change time of less than about 5 minutes. The quartz element tube 28 lines the furnace heater element 26 acting as the outside wall of a purgeable double-walled chamber 144. This prevents penetration of contaminants into the process chamber 12. The entire furnace 14 and process tube 12 assemblies are attached to a drawer-like slide mechanism 18. The simple removal of physical stops allows the furnace and process tube assemblies to be lifted up to clear the load cavity shroud. This allows the assembly to slide out of the rear of the system cabinetry for easy access. In the rear position, the process tube and furnace assemblies may be lowered to a cast sitting below. Connecting pins 70a–70n are then removed, allowing the process tube 12 and inner lift ring 33 to remain on the cart as the outer lift ring and the furnace 14 assemblies raise. The cart and the process tube 12 are then removed for cleaning. For process tube replacement, the sequence is reversed. It should be noted that this entire sequence is accomplished without disconnection of any gas, air, water or electrical service, in minutes. There is no disruption of the furnace, such as packing or thermocouple location changes. Also, the furnace may remain at low set point temperature during this procedure precluding the requirement to reprofile and potentially eliminating process test runs. A rear door in the load cavity shroud gives easy access to the internal quartz components. Another key maintenance feature is the easy access to the system base plate assembly 34. The top of the base plate is accessed by lifting the load cavity shroud. The base plate assembly 34 is pinned to the load cavity shroud by pins 72a–72n. On disconnecting the easy access gas and exhaust lines, the entire base plate assembly may be lifted with the furnace 14, process tube 12, and load cavity shroud 38. This provides easy access to the bottom of the base plate assembly 34. The gas system has a spacious exhausted compartment with excellent access to the system's lower rear. Inlet gas lines and gas lines to the base plate are served through VCR fittings to and from the gas panel shield 64. The modular concepts are retained in the design and location of the electrical system on the rear doors and the pneumatic lift system on the furnace canister at the rear.

Various modifications can be made to the present invention without departing from the apparent scope thereof.

Having thus described the present invention, we claim:

1. Vertical thermal processor comprising:
  a. framework means;
  b. base plate means supported by said framework means in a lower portion thereof;
  c. firing pedestal means supported on said base plate means;
  d. load cavity shroud means;
  e. furnace means coaxially positioned within said shroud means and adapted to coaxially position about said pedestal means;
  f. first pneumatic cylinder actuator means connected to said furnace means and said framework means for raising and lowering said furnace means relative to said base plate means;
  g. a process tube;
  h. process tube supporting ring; and,
  i. second pneumatic cylinder actuator means connected to said process tube support ring and shroud means for raising and lowering said process tube relative to base support plate whereby said furnace can be raised from said base plate independently of said process tube.

2. Vertical thermal processor of claim 1 including slidable frame means secured to a top of said framework means and said supporting means for slidable access of said furnace means, and said process tube means.

3. Vertical thermal processor of claim 1 including an access port in said framework for providing access to said pedestal means.

4. Vertical thermal processor of claim 1 including heat exchanger means in said base plate means.

5. Vertical thermal processor of claim 1 including heat exchanger means in a top of said framework means.

6. Vertical thermal processor of claim 1 including means for venting said process tube.

7. Vertical thermal processor of claim 1 including means for purging said process tube.

8. Vertical thermal processor of claim 1 including means for venting said furnace means.

9. Vertical thermal processor of claim 1 wherein said first pneumatic actuator means acts on opposing sides of said second pneumatic actuator means.

10. Vertical thermal processor of claim 1 including means for stopping said first and second pneumatic actuator means on loss of pneumatic power.

11. Vertical thermal processor of claim 1 including means for stopping said first and second pneumatic actuator means on loss of electrical power.

12. Vertical thermal processor of claim 1 including means for atmosphere control before, during and after heating.

* * * * *